US012571103B2

(12) United States Patent
Hou et al.

(10) Patent No.: US 12,571,103 B2
(45) Date of Patent: Mar. 10, 2026

(54) SEMICONDUCTOR PROCESS DEVICE AND PROCESS CHAMBER THEREOF

(71) Applicant: BEIJING NAURA MICROELECTRONICS EQUIPMENT CO., LTD., Beijing (CN)

(72) Inventors: Pengfei Hou, Beijing (CN); Jianguo Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 62 days.

(21) Appl. No.: 18/730,489

(22) PCT Filed: Jan. 13, 2023

(86) PCT No.: PCT/CN2023/072014
§ 371 (c)(1),
(2) Date: Jul. 19, 2024

(87) PCT Pub. No.: WO2023/138487
PCT Pub. Date: Jul. 27, 2023

(65) Prior Publication Data
US 2025/0354266 A1 Nov. 20, 2025

(30) Foreign Application Priority Data
Jan. 20, 2022 (CN) ......................... 202210064468.1

(51) Int. Cl.
| | |
|---|---|
| *C23C 16/509* | (2006.01) |
| *C23C 16/458* | (2006.01) |
| *H01J 37/32* | (2006.01) |

(52) U.S. Cl.
CPC ........ *C23C 16/509* (2013.01); *C23C 16/4586* (2013.01); *H01J 37/32568* (2013.01); *H01J 37/32715* (2013.01); *H01J 2237/3321* (2013.01)

(58) Field of Classification Search
CPC .............. C23C 16/509; C23C 16/4586; H01J 37/32568; H01J 37/32715; H01J 2237/3321
See application file for complete search history.

(56) References Cited

U.S. PATENT DOCUMENTS

2003/0136520 A1 7/2003 Yudovsky et al.

FOREIGN PATENT DOCUMENTS

| CN | 104561930 A | 4/2015 |
|---|---|---|
| CN | 105483647 A | 4/2016 |

(Continued)

OTHER PUBLICATIONS

The World Intellectual Property Organization (WIPO) International Search Report for PCT/CN2023/072014 Apr. 29, 2023 7 Pages (including translation).

*Primary Examiner* — Jeffrie R Lund
(74) *Attorney, Agent, or Firm* — ANOVA LAW GROUP, PLLC

(57) ABSTRACT

A process chamber includes: a furnace tube; a front flange; a rear flange; a support mechanism; a first electrode mechanism; and a second electrode mechanism. The front flange and the rear flange are respectively arranged at a furnace mouth and a furnace tail of the furnace tube. The support mechanism is arranged in the furnace tube and includes two support rods, a first end of each support rod is connected to the front flange, a second end of each support rod is connected to the rear flange, and the two support rods are used to carry a first wafer boat and a second wafer boat. The first electrode mechanism includes two first electrode (Continued)

mechanisms which are respectively sleeved on the first ends of the two support rods, the two first electrode mechanisms have opposite polarities and are used to carry a front end of the first wafer boat.

12 Claims, 5 Drawing Sheets

(56) References Cited

FOREIGN PATENT DOCUMENTS

| | | | | | |
|---|---|---|---|---|---|
| CN | 107881488 | A | | 4/2018 | |
| CN | 207904364 | U | | 9/2018 | |
| CN | 110565075 | A | | 12/2019 | |
| CN | 111139460 | A | | 5/2020 | |
| CN | 212610893 | U | | 2/2021 | |
| CN | 214458316 | U | | 10/2021 | |
| CN | 215481256 | U | | 1/2022 | |
| CN | 114411122 | A | | 4/2022 | |
| CN | 118610060 | A | * | 9/2024 | ............ C23C 16/50 |
| JP | 2001509645 | A | | 7/2001 | |
| JP | 2002518601 | A | | 6/2002 | |
| JP | 2001203163 | A5 | | 10/2007 | |
| JP | 2010059542 | A | | 3/2010 | |
| JP | 2017527984 | A | | 9/2017 | |
| JP | 2018032880 | A | | 3/2018 | |

* cited by examiner

SEMICONDUCTOR PROCESS DEVICE AND PROCESS CHAMBER THEREOF

CROSS-REFERENCE TO RELATED APPLICATIONS

This application is a national phase entry of PCT Patent Application No. PCT/CN2023/072014, filed on Jan. 13, 2023, which claims the priority of Chinese Patent Application No. 202210064468.1, filed on Jan. 20, 2022, the entire contents of all of which are incorporated herein by reference.

TECHNICAL FIELD

The present disclosure relates to the technical field of semiconductor process technologies and, more particularly, to a semiconductor process device and a process chamber thereof.

BACKGROUND

Currently, a plasma enhanced chemical vapor deposition (PECVD) device is a primary device used in a solar silicon wafer coating process, that is, a proper amount of process gas is introduced into a high vacuum process tube, and an electrode is introduced into a graphite boat in the process tube. The silicon wafer is placed on two discharging poles of the graphite boat, and a low-voltage radio frequency glow discharge is used at a certain temperature to make the process gas react chemically to form a layer of SixNy film on the surface of the silicon wafer.

In the prior art, a cantilever PECVD device is proposed, that is, a sealed furnace door of the process tube and a cantilever paddle are an integrated structure. After the cantilever paddle sends a wafer boat into the process tube, there is no falling action. The wafer boat completes the coating process on the cantilever paddle, and a front electrode introduction structure is connected to a front furnace door for introducing the electrode into the wafer boat. Another wafer boat is placed near a furnace tail of the process tube, and a rear electrode introduction structure is connected to a rear furnace door for introducing the electrode into the wafer boat, that is, the prior art adopts a double boat method to improve the production capacity of silicon wafers. However, because the front electrode mechanism and its access cable also move with the opening and closing of the front furnace door and the movement of the cantilever paddle, the front electrode mechanism is relatively complex and occupies a large space. In addition, due to the inherent disadvantages of the cantilever structure, it is no longer suitable for the existing large-capacity PECVD device.

SUMMARY

In view of the disadvantages of the prior art, the present disclosure proposes a semiconductor process device and a process chamber thereof to solve the technical problems in the prior art that the electrode structure and its access cable movement structure are complex and occupy a large space, and to avoid the technical problem of using a cantilever structure.

One aspect of the present disclosure provides a process chamber of a semiconductor process device. The process chamber includes a furnace tube, a front flange, a rear flange, a support mechanism, a first electrode mechanism, and a second electrode mechanism. The front flange and the rear flange are respectively arranged at a furnace mouth and a furnace tail of the furnace tube. The support mechanism is arranged in the furnace tube and includes two support rods, a first end of each support rod is connected to the front flange, a second end of each support rod is connected to the rear flange, and the two support rods are used to carry a first wafer boat and a second wafer boat. The first electrode mechanism includes two first electrode mechanisms which are respectively sleeved on the first ends of the two support rods, the two first electrode mechanisms have opposite polarities and are used to carry a front end of the first wafer boat when the first wafer boat is loaded on the support rods and are respectively electrically connected to two terminals at the front end of the first wafer boat to introduce electrodes into the first wafer boat. The second electrode mechanism includes two second electrode mechanisms which are both arranged at the furnace tail of the furnace tube, and are used to introduce electrodes into the second wafer boat when the second wafer boat is loaded on the support rods.

In some embodiments, each first electrode mechanism includes an electrode support assembly and an electrode introduction assembly, the electrode support assembly is sleeved on the first end of the corresponding support rod, when the first wafer boat is loaded on the support rods, the electrode support assembly carries the front end of the first wafer boat and is electrically connected to the corresponding terminal at the front end of the first wafer boat; and the electrode introduction assembly is inserted into the front flange, one end of the electrode introduction assembly is electrically connected to the electrode support assembly, and the other end of the electrode introduction assembly is electrically connected to an RF power supply.

In some embodiments, the support mechanism also includes a plurality of bearing blocks, the plurality of bearing blocks are arranged on the front flange and the rear flange, the first end and the second end of each support rod are respectively fixedly connected to the front flange and the rear flange through at least one bearing block. The electrode support assembly is snap-fitted or plugged into each bearing block, and the two are electrically insulated from each other.

In some embodiments, the electrode support assembly includes a support tube, a connecting rod, a connecting component, an insulating component, and an adapter block, the support tube is sleeved on an outer periphery of the support rod. The adapter block is detachably connected to the support tube to carry the front end of the first wafer boat, and is electrically connected to the terminal corresponding to the front end of the first wafer boat. One end of the connecting rod is fixedly connected to the support tube and electrically conductive, the other end of the connecting rod is fixedly connected to the connecting component and electrically conductive, and the connecting rod is arranged along an extension direction of the support rod. The connecting component is clamped or plugged with each bearing block, and is electrically connected to the electrode introduction assembly. The insulating component is arranged between the connecting component and each bearing block to electrically insulate the two.

In some embodiments, the electrode support assembly also includes a positioning end plate and a positioning member, the positioning end plate is arranged on an outer peripheral wall of the support tube, and the positioning member is used to position and connect the adapter block with the positioning end plate.

In some embodiments, the connecting component includes a supporting plate and a connecting plate, and one end of the supporting plate is fixedly connected to the connecting rod and electrically conductive. The connecting plate is a bent structure having two bent portions arranged at an angle, one of the two bent portions is fitted with the insulating component and fixedly connected to the other end of the supporting plate and is electrically conductive. The other bent portion is fixedly connected to the electrode introduction assembly and is conductive. A step is provided on the insulating component for supporting the supporting plate.

In some embodiments, a connecting pipe is provided on a peripheral wall of the front flange passing through the front flange. The electrode introduction assembly includes an introduction rod, an insulating sleeve, and a socket, the insulating sleeve is sleeved on an outer periphery of the introduction rod and penetrates through the connecting pipe, one end of the introduction rod is electrically connected to the electrode support assembly, and the other end of the introduction rod is electrically connected to the socket. A sealing boss is provided on an outer periphery of an end of the insulating sleeve facing toward the socket, which is used for sealing connection with an end of the connecting pipe. The socket is sleeved on an outer periphery of the end of the connecting pipe, which is used for pressing the sealing boss onto the end of the connecting pipe.

In some embodiments, the support mechanism further includes a clamping member, a limiting groove is provided on each bearing block for accommodating the first end or the second end of the support rod, the clamping member is provided on each bearing block to press the first end or the second end into the limiting groove.

In some embodiments, the support mechanism further includes a plurality of first bearing sleeves, a plurality of second bearing sleeves, and a plurality of stoppers, each first bearing sleeve is disposed between the support rod and the support tube and the connecting rod, and is used to isolate the support rod from the support tube and the connecting rod. The plurality of second bearing sleeves are sleeved on the support rods and are distributed on the support rods at positions for supporting the rear end of the first wafer boat and the front end and rear end of the second wafer boat. The plurality of stoppers are fixedly disposed on the support rods, and are used to position the plurality of first bearing sleeves and the plurality of second bearing sleeves, respectively.

In some embodiments, the support rod is made of semiconductor material, and the plurality of first bearing sleeves and the plurality of second bearing sleeves are both made of insulating material.

In some embodiments, one of the two second electrode mechanisms includes a first introduction rod, and the other includes a second introduction rod, the first introduction rod and the second introduction rod are both arranged on the rear furnace door of the process chamber for electrical connection with the rear end of the second wafer boat, and the polarities of the first introduction rod and the second introduction rod are opposite.

Another aspect of the present disclosure provides a semiconductor process device, comprising the disclosed process chamber.

The embodiments of the present disclosure at least achieve the following beneficial effects. The embodiments of the present disclosure provide the support mechanism in the furnace tube, the first electrode mechanism at the first end of the support rod, and the second electrode mechanism at the furnace tail of the furnace tube. The first wafer boat is supported by the first electrode mechanism in cooperation with the support rod, and the first electrode mechanism introduces the electrodes into the first wafer boat. The second wafer boat is supported by the support rod, and the second electrode mechanism introduces the electrodes into the second wafer boat, to prevent the first electrode mechanism from moving with the cantilever paddles and the front furnace door, thereby not only making the structure of the first electrode mechanism simple, but also substantially reducing the occupied space. In addition, because the support rod and the first electrode mechanism are used to carry the first wafer boat, various disadvantages caused by the cantilever structure in the prior art can be avoided, thereby optimizing the performance of the semiconductor process device.

Additional aspects and advantages of the present application will be partially given in the following description, which will become apparent from the following description, or will be understood through the practice of the present disclosure

BRIEF DESCRIPTION OF THE DRAWINGS

The above and/or additional aspects and advantages of the present disclosure will become apparent and easy to understand from the following description of the embodiments in conjunction with the accompanying drawings.

DETAILED DESCRIPTION OF THE EMBODIMENTS

Figure 1:
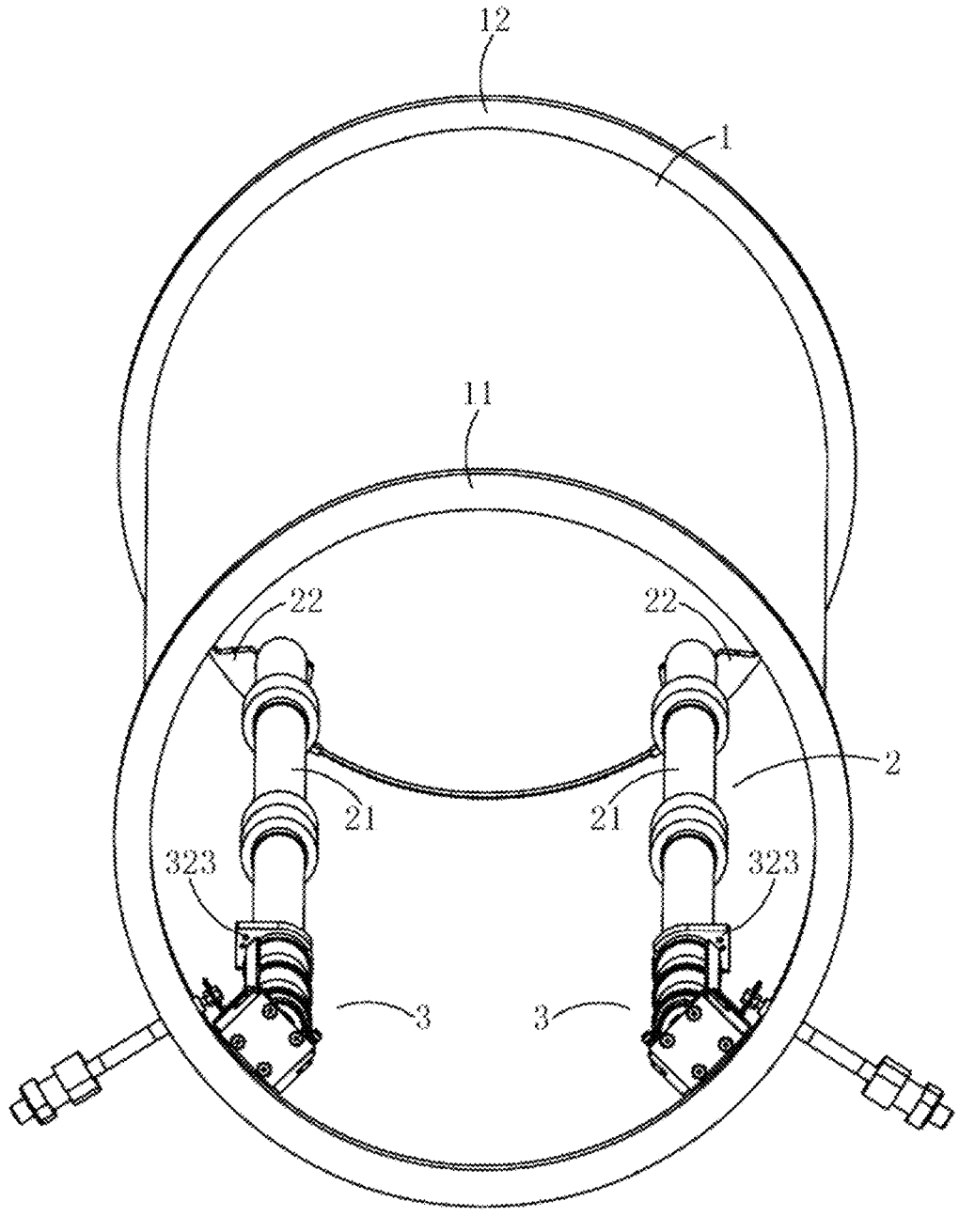
FIG. 1 is a structural schematic diagram of a process chamber according to some embodiments of the present disclosure.

The present disclosure is described in detail below. Examples of embodiments of the present disclosure are shown in the accompanying drawings, where the same or similar reference numerals throughout represent same or similar components or components with same or similar functions. In addition, if a detailed description of a known technology is unnecessary for the features of the present disclosure shown, it will be omitted. The embodiments described below with reference to the accompanying drawings are exemplary and are merely used to explain the present disclosure, and cannot be interpreted as limiting the present disclosure.

It can be understood by those skilled in the art that, unless otherwise defined, all terms (including technical terms and scientific terms) used herein have the same meaning as the general understanding of ordinary people skilled in the art to which the present disclosure belongs. It should also be understood that terms such as those defined in general dictionaries should be understood to have a meaning consistent with the meaning in the context of the prior art, and will not be interpreted with an idealized or overly formal meaning unless specifically defined herein.

The technical solution of the present disclosure and how the technical solution of the present disclosure solves the above-described technical problems are described in detail below with specific embodiments.

Figure 2:
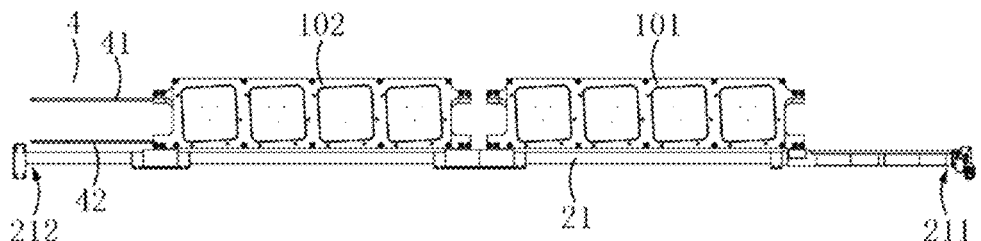
FIG. 2 is a structural schematic diagram of a support mechanism coupling with a first wafer boat and a second wafer boat according to some embodiments of the present disclosure.

The embodiments of the present disclosure provide a process chamber of a semiconductor process device. Structural schematic diagrams of the process chamber are shown in FIG. 1 and FIG. 2. As shown in FIG. 1 and FIG. 2, the process chamber includes: a furnace tube 1, a front flange 11, a rear flange 12, a support mechanism 2, a first electrode mechanism 3 and a second electrode mechanism 4. The front flange 11 and the rear flange 12 are respectively arranged at a furnace mouth and a furnace tail of the furnace tube 1. The support mechanism 2 is arranged in the furnace tube 1, and includes two support rods 21. A first end 211 of each support rod 21 is connected to the front flange 11, and a second end 212 of each support rod 21 is connected to the rear flange 12. The two support rods 21 are used to carry a first wafer boat 101 and a second wafer boat 102. There are two first electrode mechanisms 3, which are respectively sleeved on the first ends 211 of the two support rods 21. The two first electrode mechanisms 3 have opposite polarities, and are used to carry a front end of the first wafer boat 101 when the first wafer boat 101 is loaded on the support rods 21, and are respectively electrically connected to two terminals at the front end of the first wafer boat 101 (i.e., front boat feet for introducing electrodes) to introduce electrodes into the first wafer boat 101. There are two second electrode mechanisms 4, which are both arranged at the furnace tail of the furnace tube 1, and are used to introduce electrodes into the second wafer boat 102 when the second wafer boat 102 is loaded on the support rods 21.

As shown in FIG. 1 and FIG. 2, the process chamber provided by the embodiment of the present disclosure may be applied to a horizontal plasma enhanced chemical vapor deposition (PECVD) device. But the embodiment of the present disclosure does not limit specific types of semiconductor process devices, and those skilled in the art can adjust the configurations according to actual conditions. The furnace tube 1 may be a tubular structure made of quartz material. A front side of the furnace tube 1 is the furnace mouth. The front flange 11 may be disposed at the furnace mouth, and a front furnace door may be provided in combination to facilitate transfer of the first wafer boat 101 and the second wafer boat 102 into the furnace tube 1. A rear side of the furnace tube 1 is the furnace tail. The rear flange 12 may be disposed at the furnace tail, and a rear furnace door may be provided or a closed structure may be directly used. But the embodiment of the present disclosure is not limited thereto. Each support rod 21 of the support mechanism 2 may be a rod-shaped structure made of semiconductor material. But the embodiment of the present disclosure is not limited thereto. For example, each support rod 21 may be made of ceramic material or other insulating material. There may be two support rods 21 and they are arranged in parallel with each other in the furnace tube 1. The first end 211 and the second end 212 of each support rod 21 are fixedly connected to the front flange 11 and the rear flange 12 respectively, thereby preventing the furnace tube 1 from bearing any weight directly. Instead, the front flange 11 and the rear flange 12 bear the weight, which prevents the support mechanism 2 and the two wafer boats from causing damage to the furnace tube 1, thereby effectively improving safety and stability, effectively reducing a failure rate of the furnace tube 1, and reducing maintenance and operation costs. Because the two support rods 21 are used to carry the first wafer boat 101 and the second wafer boat 102, the two wafer boats are sent into the furnace tube 1 by cantilever paddles and then fall downward. After the two wafer boats are supported by the support rods 21, the cantilever paddles exit the furnace tube 1 and the furnace tube 1 is sealed by the front furnace door before the process is performed. That is, the embodiment of the present disclosure overcomes various disadvantages brought about by the cantilever structure in the prior art. The two first electrode mechanisms 3 are respectively arranged on the two support rods 21, and are sleeved on the two first end 211 and connected to the front flange 11. That is, the two first electrode mechanisms 3 may be arranged near the furnace mouth of the furnace tube 1. The two first electrode mechanisms 3 are used to support the front ends of the first wafer boat 101, and are respectively electrically connected to the two terminals at the front end of the first wafer boat 101. The rear end of the first wafer boat 101 may be supported on the two support rods 21. That is, the two first electrode mechanisms 3 cooperate with the two support rods 21 to support the first wafer boat 101. One of the two first electrode mechanisms 3 may be a positive electrode, and the other may be a negative electrode. But the embodiment of the present disclosure is not limited thereto. For example, the first electrode mechanisms 3 may also be arranged in pairs, and multiple pairs are arranged. The two first electrode mechanisms 3 in each pair are respectively positive and negative. As such, the support rods 21 are also arranged in pairs, and the number of pairs is the same as the number of pairs of the first electrode mechanisms 3, and they are arranged in a one-to-one correspondence. Multiple pairs of support rods 21 may be used to jointly support the first wafer boat 101 and the second wafer boat 102. Multiple pairs of first electrode mechanisms 3 are used to jointly introduce electrodes into the first wafer boat 101. The above design not only avoids the disadvantages caused by the cantilever paddle bearing of the first wafer boat 101, but also introduces the electrodes at the front end of the first wafer boat 101, such that the embodiment of the present disclosure is simple in structure and can also reduce an occupied space. The two second electrode mechanisms 4 are both arranged at the furnace tail of the furnace tube 1. That is, the two second electrode mechanisms 4 are both arranged near the second end 212 of each support rod 21, and the two second electrode mechanisms 4 are electrically connected to the second wafer boat 102 (that is, respectively to the two terminals of the second wafer boat 102, the rear boat feet) to introduce the electrodes into the second wafer boat 102. One of the two second electrode mechanisms 4 may be a positive electrode, and the other may be a negative electrode. But the embodiment of the present disclosure is not limited thereto. Similar to the first electrode mechanism 3, the second electrode mechanism 4 may also be arranged in pairs, and the number of pairs is the same as the number of pairs of the support rods 21, and they are arranged in a one-to-one correspondence. Multiple pairs of second electrode mechanisms 4 are used to introduce the electrodes into the second wafer boat 102 together.

In the embodiments of the present disclosure, the support mechanism is provided in the furnace tube. The first electrode mechanism is provided at the first end of the support rod, and the second electrode mechanism is provided at the furnace tail of the furnace tube. The first electrode mechanism cooperates with the support rods to support the first wafer boat, and the first electrode mechanism introduces the electrodes into the first wafer boat. The second wafer boat is supported by the support rods, and the second electrode mechanism introduces the electrodes into the second wafer boat, thereby preventing the first electrode structure from moving with the cantilever paddles and the front furnace door, not only making the structure of the first electrode mechanism simple, but also greatly reducing the occupied space. In addition, because the support rods and the first electrode mechanism cooperate to carry the first wafer boat, various disadvantages brought by the cantilever structure in the prior art can be avoided, thereby optimizing the performance of the semiconductor process device.

In some embodiments, as shown in FIGS. 1-4, the first electrode mechanism 3 includes an electrode support assembly 32 and an electrode introduction assembly 33. The electrode support assembly 32 is sleeved on the first end 211 of the corresponding support rod 21. When the first wafer boat 101 is loaded on the support rods 21, the electrode support assembly 32 carries the front end of the first wafer boat 101 and is electrically connected to the corresponding terminal at the front end of the first wafer boat 101. The electrode introduction assembly 33 is inserted into the front flange 11. One end of the electrode introduction assembly 33 is electrically connected to the electrode support assembly 32, and the other end of the electrode introduction assembly 33 is electrically connected to an RF power supply.

Specifically, each first electrode mechanism 3 includes an electrode support assembly 32 and an electrode introduction assembly 33. The electrode support assembly 32 is a sleeve structure as a whole, which can be sleeved on the first end 211 of the corresponding support rod 21, and when the first wafer boat 101 is loaded on the support rod 21, the electrode support assembly 32 carries the front end of the first wafer boat 101 and is electrically connected to the corresponding terminal at the front end of the first wafer boat 101. Because the electrode support assembly 32 is sleeved (for example, concentrically sleeved) on the corresponding support rod 21, the occupied space may be substantially saved. The electrode introduction assembly 33 as a whole may adopt a rod-shaped structure, which is inserted into the front flange 11 and extends into the front flange 11, such that one end of the electrode introduction assembly 33 is electrically connected to the electrode support assembly 32, and the other end is electrically connected to the RF power supply. The electrode introduction assembly 33 introduces the electrodes into the electrode support assembly 32, and then into the first wafer boat 101. With the above-described design, because the electrode support assembly 32 and the electrode introduction assembly 33 are both arranged on the front flange 11, an overall position of the first electrode mechanism 3 is arranged close to the furnace mouth, which is convenient for disassembly and maintenance, thereby substantially improving disassembly and maintenance efficiency.

In some embodiments, as shown in FIGS. 1-4, the support mechanism 2 also includes a plurality of bearing blocks 22. The plurality of bearing blocks 22 are arranged on the front flange 11 and the rear flange 12. The first end 211 and the second end 212 of each support rod 21 are respectively fixedly connected to the front flange 11 and the rear flange 12 through at least one bearing block 22. The electrode support assembly 32 is snap-fitted or plugged into each bearing block 22, and the two are electrically insulated from each other. By snapping or plugging the electrode support assembly 32 with the bearing block 22, the electrode support assembly 32 can be prevented from rotating when carrying the first wafer boat 101, ensuring that a contact position of the terminal (i.e., the front boat foot) of the first wafer boat 101 is horizontal and does not rotate, thereby reducing probability of poor contact and improving stability of the embodiment of the present disclosure.

As shown in FIGS. 1-4, the bearing block 22 may have a bottom surface being an arc surface structure. The arc surface structure is used to cooperate with an inner arc of the front flange 11 and the rear flange 12. A top surface of the bearing block 22 is used to fix the first end 211 or the second end 212 of each support rod 21. For example, the plurality of bearing blocks 22 include four bearing blocks 22. Two of the four bearing blocks 22 are respectively located at the first ends 211 of the two support rods 21, and the other two are respectively located at the second ends 212 of the two support rods 21. The bottom surface of the bearing block 22 is arranged to fit the inner arc surface of the front flange 11 or the rear flange 12, to fix the corresponding support rod 21. In some embodiments, the plurality of bearing blocks 22 are provided with a plurality of oblong through-holes arranged along a circumferential direction of a furnace tube 1. A plurality of fasteners are connected to the front flange 11 or the rear flange 12 after passing through the plurality of oblong through-holes. Due to the effect of the plurality of oblong through-holes, spacing between the two support rods 21 in the circumferential direction of the furnace tube 1 may be freely adjusted, such that the embodiment of the present disclosure can be applied to wafer boats of different widths to improve the applicability and scope of application. Because the spacing between the two support rods 21 is adjustable, interference caused by on-site machine assembly errors can be avoided. In addition, an end of the electrode support assembly 32 may be snapped or plugged with two sides of the bearing block 22 to prevent the electrode support assembly 32 from rotating when carrying the first wafer boat 101, ensuring that the front boat foot contact position of the first wafer boat 101 does not rotate horizontally, reducing the probability of poor contact, and thus improving the stability of the embodiment of the present application.

In some embodiments, as shown in FIGS. 1-5, the electrode support assembly 32 includes a support tube 3211, a connecting rod 3212, a connecting component 3213, an insulating component, and an adapter block 323. The support tube 3211 is sleeved on an outer periphery of the support rod 21. The adapter block 323 is detachably connected to the support tube 3211 to carry the front end of the first wafer boat 101, and is electrically connected to the terminal corresponding to the front end of the first wafer boat 101. One end of the connecting rod 3212 is fixedly connected to the support tube 3211 and electrically conductive, and the other end of the connecting rod 3212 is fixedly connected to the connecting component 3213 and electrically conductive. The connecting rod 3212 is arranged along an extension direction of the support rod 21. The connecting component 3213 is clamped or plugged with the bearing block 22, and is electrically connected to the electrode introduction assembly 33. The insulating component is arranged between the connecting component 3213 and the bearing block 22 to electrically insulate the two.

As shown in FIGS. 1-5, the support tube 3211 includes two circular rings and a circular tube coaxially arranged to form a sleeve structure. The two connecting rods 3212 are respectively arranged on both sides of the sleeve structure to achieve a fixed connection between the support tube 3211 and the connecting component 3213. The support tube 3211 as a whole may be sleeved on the first end 211 of the support rod 21. The above design not only simplifies an overall structure, but also reduces a contact area between the electrode support assembly 32 and the support rod 21. One end of the connecting rod 3212 is fixedly connected to the support tube 3211, for example, fixedly connected to the circular tube of the support tube 3122, and the other end is fixedly connected to the connecting component 3213. The connecting component 3213 is, for example, fixedly engaged with both sides of the bearing block 22, or may be connected in other detachable ways such as plugging, etc. The embodiment of the present disclosure does not limit thereto. The connecting component 3213 is electrically connected to the electrode introduction assembly 33, and an insulating member may be provided between the connecting member 3213 and the bearing block 22 to electrically insulate the two, thereby avoiding a short circuit between the electrode introduction assembly 33 and the electrode support assembly 32 and the support rod 21. In addition, the insulating member may also prevent the support tube 3211 from rotating, thereby improving the stability of the first wafer boat 101. A top surface of the adapter block 323 is used to carry the terminal (i.e., the front boat foot) of the first wafer boat 101, and a bottom surface of the adapter block 323 is provided with a semi-cylindrical groove for detachably cooperating with the outer periphery of the support tube 3211. For example, the adapter block 323 may be detachably positioned and connected with the outer periphery of the circular tube of the support tube 3211. In actual applications, the adapter block 323 is partially located above the support tube 3211 and partially located outside the support tube 3211. Two adapter blocks 323 on two support tubes 3211 cooperate with each other to support two terminals (i.e., the front boat feet) of the first wafer boat 101. With the above design, because the adapter block 323 and the support tube 3211 are detachably connected, the adapter block 323 may be directly detached from the support tube 3211 when maintenance is required to grind a coating layer of the adapter block 323, thereby substantially improving the efficiency of the disassembly and maintenance, and further reducing operation and maintenance costs.

It should be noted that the embodiments of the present disclosure do not limit the specific structure of the electrode support assembly 32. For example, the electrode support assembly 32 adopts an integrally formed structure. Thus, the embodiments of the present disclosure do not limit thereto. Those skilled in the art can adjust the configurations according to actual conditions.

Figure 3:
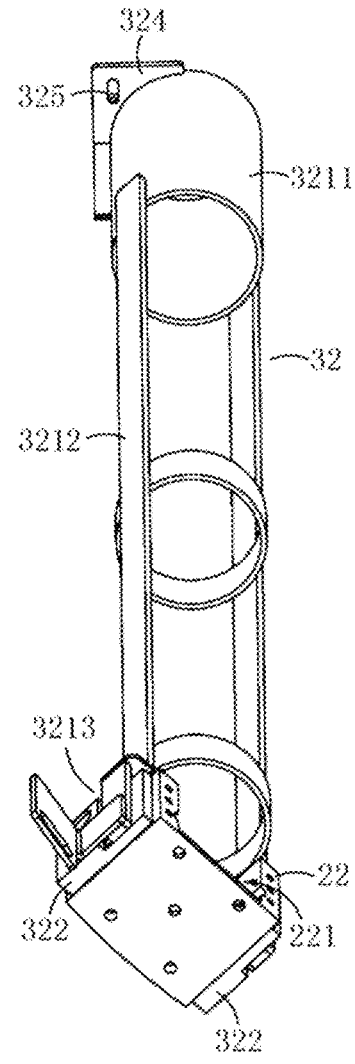
FIG. 3 is a structural schematic diagram of an electrode support assembly according to some embodiments of the present disclosure.
Figure 5:
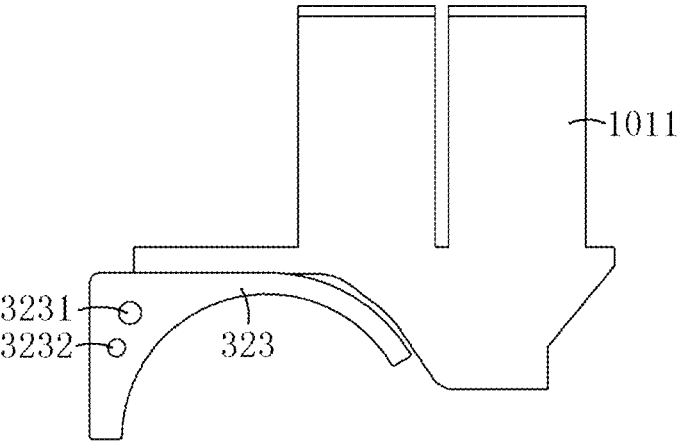
FIG. 5 is a structural schematic diagram of a front boat foot of the first wafer boat coupling with an adapter block according to some embodiments of the present disclosure.

In some embodiments, as shown in FIGS. 1, 3, and 5, the electrode support assembly 32 also includes a positioning end plate 324 and a positioning member 325. The positioning end plate 324 is arranged on an outer peripheral wall of the support tube 3122. The positioning member 325 is used to position and connect the adapter block 323 with the positioning end plate 324. In some embodiments, a clamping structure 3232 is provided on the adapter block 323 for clamping with a clamping tool, such that the adapter block 323 can be separated from the positioning member 325 under an action of a clamping tool and can be sent out of the furnace tube 1.

As shown in FIGS. 1, 3, and 5, the positioning end plate 324 may be an "L" shaped structure as a whole, and a horizontal plate of the positioning end plate 324 is located at the bottom of the support tube 3211, and an arc-shaped notch is opened on a vertical plate to cooperate with the outer peripheral wall of the support tube 3211 and be fixedly connected. The positioning member 325 is arranged on the vertical plate of the positioning end plate 324, and an axial direction of the positioning member 325 is arranged parallel to an axial direction of the support tube 3211. The adapter block 323 may penetrate into a positioning hole 3231, and the adapter block 323 may move along the axial direction of the support tube 3211. At this point, the positioning member 325 extends into the positioning hole 3231, and the adapter block 323 stops moving when a side of the adapter block 323 is in contact with a side of the positioning end plate 324, thereby completing a positioning connection between the adapter block 323 and the support tube 3211. The above structure also makes the adapter block 323 easy to disassemble, thereby further improving the efficiency of disassembly and maintenance. The clamping structure 3232 is, for example, a through-hole passing through the adapter block 323, which is used for clamping with a clamping tool. That is, when the adapter block 323 needs to be maintained, the clamping tool can be inserted into the clamping structure 3232, to facilitate the transfer of the adapter block 323 to the outside of the furnace tube 1, thereby substantially improving the efficiency of disassembly and maintenance. The above design also prevents the adapter block 323 from falling and causing damage to the furnace tube 1, thereby improving the safety of the embodiments of the present disclosure.

It should be noted that the embodiments of the present disclosure do not limit the positioning method between the adapter block 323 and the support tube 3211. For example, a plurality of positioning members 325 are arranged on the outer periphery of the support tube 3211, and a plurality of corresponding positioning holes 3231 are arranged on the side where the adapter block 323 cooperates with the support tube 3211. Thus, the embodiments of the present disclosure do not limit thereto. Those skilled in the art can adjust the configurations according to actual conditions.

Figure 4:
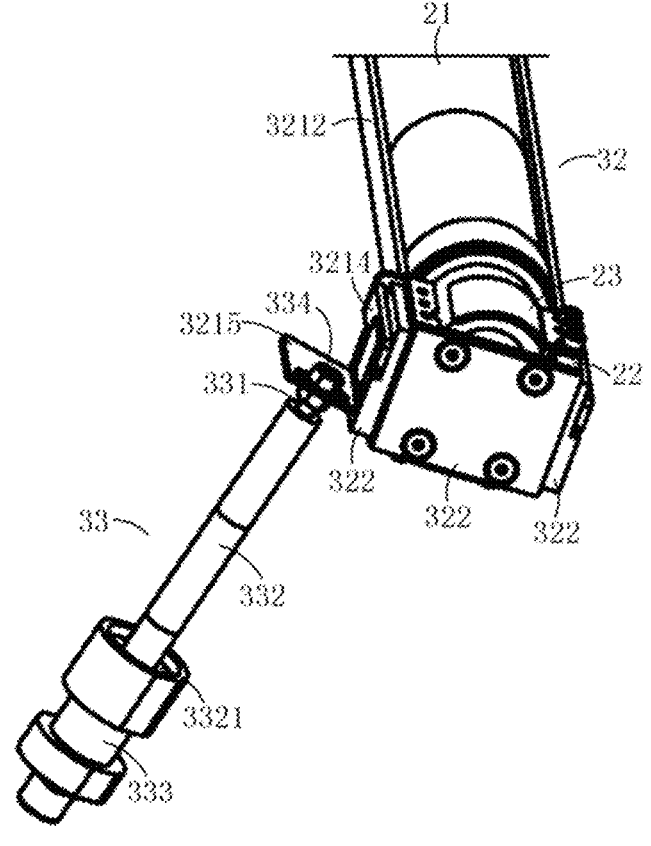
FIG. 4 is a partially enlarged structural schematic diagram of a first electrode mechanism according to some embodiments of the present disclosure.

In some embodiments, as shown in FIGS. 3 and 4, the connecting component 3213 includes a supporting plate 3214 and a connecting plate 3215. One end of the supporting plate 3214 is fixedly connected to the connecting rod 3212 and is electrically conductive. The connecting plate 3215 is a bent structure having two bent portions arranged at an angle. One of the two bent portions is fitted with the insulating component and fixedly connected to the other end of the supporting plate 3214 and is electrically conductive. The other bent portion is fixedly connected to the electrode introduction assembly 33 and is conductive. A step is provided on the insulating component for supporting the supporting plate 3214.

As shown in FIGS. 3 and 4, the connecting component 3213 includes two oppositely arranged supporting plates 3214. The two supporting plates 3214 are respectively arranged on both sides of the bearing block 22, and are connected to the end of the connecting rod 3212 through an end plate. Various components may be fixedly connected by welding. The adoption of this design makes the structure of the embodiment of the present disclosure simple and easy to implement, and further improves the stability of the embodiment of the present disclosure. The connecting plate 3215 may be an "L"-shaped structure. The vertical plate of the connecting plate 3215 may be attached to the supporting plate 3214, and may be partially attached to the insulating component. The horizontal plate of the connecting plate 3215 may be connected with the electrode introduction component 33. That is, the connecting plate 3215 may be a bent structure. One portion of the bent structure is fixedly connected to the supporting plate 3214 and electrically conductive, and the other portion of the bent structure is attached to the insulating component, and is fixedly connected to the electrode introduction component 33 and electrically conductive. The insulating component may include three insulating plates 322. Two insulating plates 322 are respectively arranged on both sides of the bearing block 22, and are located between the two supporting plates 3214 of the connecting component 3213 and the bearing block 22, to prevent a short circuit between the connecting component 3213 and the bearing block 22. Further, a step surface is provided on opposite side surfaces of the two insulating plates 322, to accommodate the supporting plate 3214, and to be clamped or plugged therewith, such that the connecting component 3213 is confined, thereby further improving the stability of the support tube 3211 and preventing rotation. But the embodiments of the present disclosure are not limited thereto. Another insulating plate 322 may be arranged on the outside of the bearing block 22. That is, the insulating plate 322 is arranged on a side surface of the plurality of bearing blocks 22 facing away from the support rod 21. When actually being used, the third insulating plate 322 prevents discharge and sparks between the bearing block 22 and the connecting component 3213 and the front furnace door, thereby further improving the safety and stability of the embodiments of the present disclosure. Each insulating plate 322 may be connected to the bearing block 22 by bolts. But the embodiments of the present disclosure are not limited thereto.

It should be noted that the embodiments of the present disclosure do not limit the specific structure of the insulating component. For example, the insulating component may also adopt an integral structure. That is, the three insulating plates 322 are integrally formed. Thus, the embodiments of the present disclosure do not limit thereto, and those skilled in the art can adjust the configurations according to actual conditions.

Figure 7:
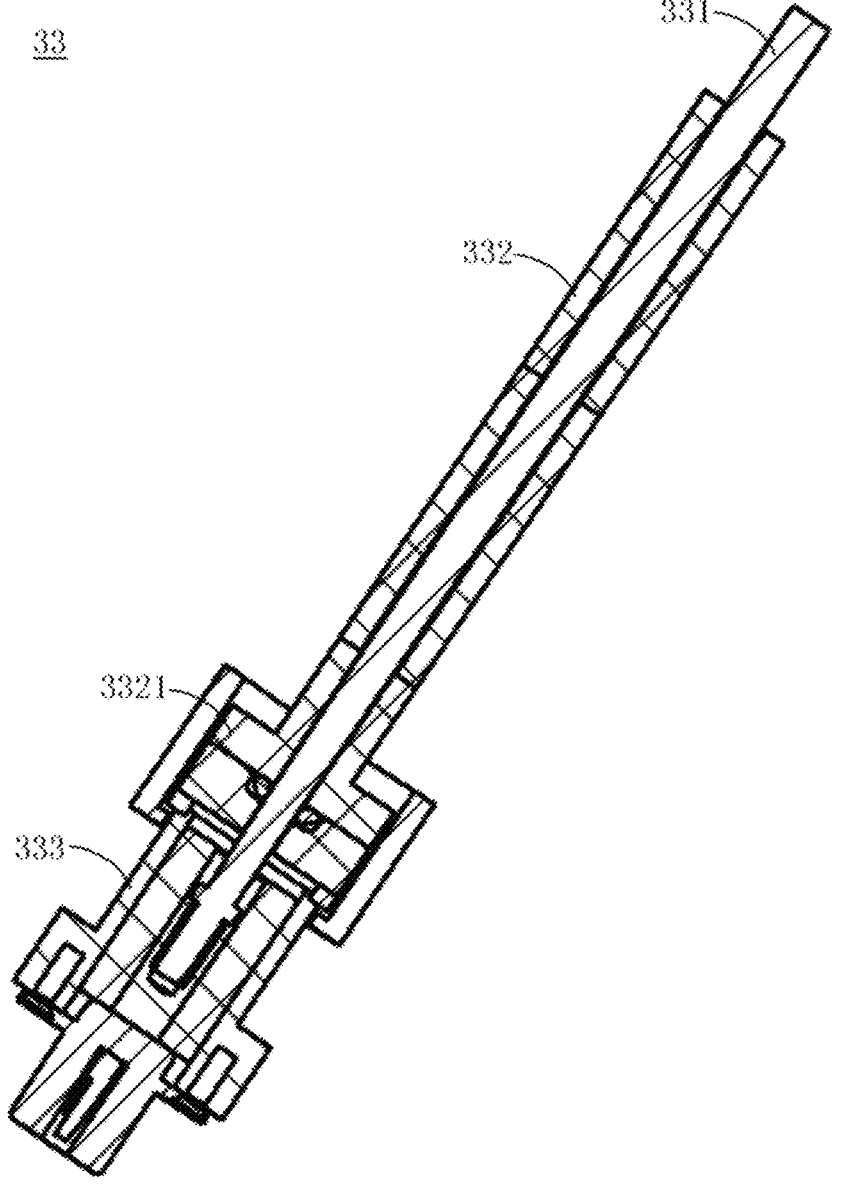
FIG. 7 is a cross-sectional view of an electrode introduction assembly according to some embodiments of the present disclosure.

In some embodiments, as shown in FIGS. 1, 4, and 7, a connecting pipe (not shown in the drawings) is provided on a peripheral wall of the front flange 11 passing through the front flange 11. The electrode introduction assembly 33 includes an introduction rod 331, an insulating sleeve 332, and a socket 333. The insulating sleeve 332 is sleeved on the outer periphery of the introduction rod 331 and penetrates through the connecting pipe. One end of the introduction rod 331 is electrically connected to the electrode support assembly 32, and the other end of the introduction rod 331 is electrically connected to the socket 333. A sealing boss 3321 is provided on an outer periphery of an end of the insulating sleeve 332 facing toward the socket 333, which is used for sealing connection with an end of the connecting pipe. The socket 333 is sleeved on an outer periphery of the end of the connecting pipe, which is used for pressing the sealing boss 3321 onto the end of the connecting pipe.

As shown in FIGS. 1, 4, and 7, one end of the connecting pipe is connected to the outer peripheral wall of the front flange 11, and the other end is provided with, for example, an external thread. The connecting pipe as a whole extends along a radial direction of the front flange 11. The connecting pipe is used to connect the inside and the outside of the front flange 11. An outer periphery of the introduction rod 331 is covered with the insulating sleeve 332, such that the introduction rod 331 can be nested in the connecting pipe, and insulation is achieved between the introduction rod 331 and the connecting pipe and the front flange 11 through the insulating sleeve 332. One end of the introduction rod 331 located in the front flange 11 is electrically connected to the electrode support assembly 32, for example, through the connecting plate 3215 and the fastener 334. But the embodiments of the present disclosure are not limited thereto. Another end of the introduction rod 331 located outside the front flange 11 is electrically connected to the RF power supply through the socket 333. Furthermore, the sealing boss 3321 is provided at an end of the insulating sleeve 332 located outside the front flange 11. That is, the sealing boss 3321 is provided on the outer periphery of the end of the insulating sleeve 332 facing toward the socket 333, and the sealing boss 3321 is pressed against the end surface of the connecting pipe. A flexible sealing ring (not shown in the drawings) is provided between the two to achieve sealing between the insulating sleeve 332 and the front flange 11. The socket 333 may be a coaxial cable socket, and is connected with the external thread of the end of the connecting pipe by tightening the nut. While achieving connection with the introduction rod 331, the sealing boss 3321 and the flexible seal may be pressed against the end surface of the connecting pipe, thereby achieving a sealed connection between the electrode introduction assembly 33 and the front flange 11. The above design makes the structure of the electrode introduction assembly 33 simple and easy to implement. Because the socket 333 is connected to the connecting pipe by screwing, the embodiments of the present disclosure can be disassembled and maintained merely by manual operation, thereby substantially improving the efficiency of disassembly and maintenance. However, the embodiments of the present disclosure do not limit the specific structure of the electrode introduction component 33, as long as it can achieve sealing with the front flange 11 and introduce the electrode into the electrode support assembly component 32. Therefore, the embodiments of the present disclosure are not limited thereto. Those skilled in the art may adjust the configurations according to actual conditions.

In some embodiments, as shown in FIGS. 1 to 4, the support mechanism 2 further includes a clamping member 23, and a limiting groove 221 is provided on the bearing block 22 for accommodating the first end 211 or the second end 212 of the support rod 21. The clamping member 23 is provided on the bearing block 22 to press the first end 211 or the second end 212 into the limiting groove 221. Specifically, the limiting groove 221 is provided on the bearing block 22. The limiting groove 221 is a semi-cylindrical groove for accommodating the first end 211 or the second end 212 of the support rod 21. But the embodiments of the present disclosure do not limit the specific shape of the limiting groove 221, as long as it is arranged corresponding to the shape of the support rod 21. The clamping member 23 may adopt a semi-arc plate-like structure. When the support rod 21 is accommodated in the limiting groove 221, the clamping member 23 covers the limiting groove 221 and is connected to the bearing block 22 through a plurality of bolts. For example, a plurality of connecting holes are provided on both sides of a top opening of the limiting groove 221. The plurality of connecting holes are used to cooperate with the bolts such that the clamping member 23 presses the support rod 21 in the limiting groove 221. The above design makes the structure of the embodiments of the present disclosure simple, and also improves the stability and the safety, thereby reducing a failure rate and extending a service life. It should be noted that the embodiments of the present disclosure do not necessarily include the clamping member 23 in all embodiments. For example, a receiving groove is provided on a side of the bearing block 22 facing toward the support rod 21 to accommodate the support rod 21 and to limit the position of the support rod 21. Therefore, the embodiments of the present disclosure are not limited thereto. Those skilled in the art may adjust the configurations according to actual conditions.

Figure 6:
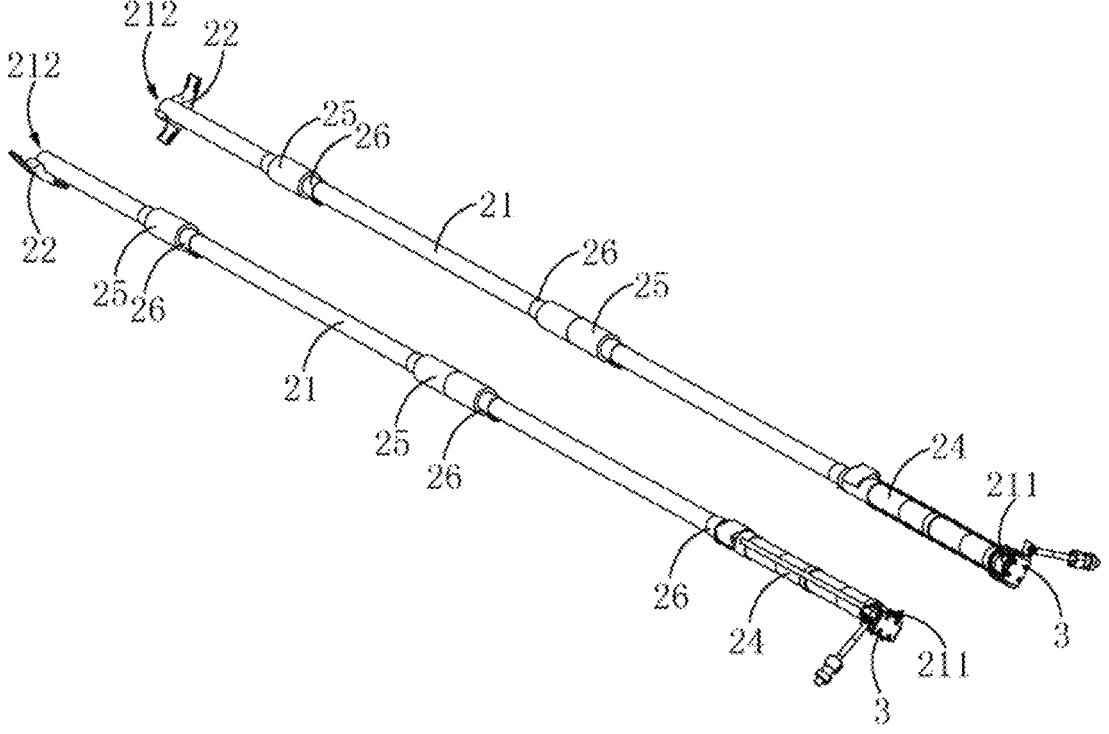
FIG. 6 is a structural schematic diagram of another support mechanism according to some embodiments of the present disclosure.

In some embodiments, as shown in FIG. 1, FIG. 2, and FIG. 6, the support mechanism 2 further includes a plurality of first bearing sleeves 24, a plurality of second bearing sleeves 25, and a plurality of stoppers 26. Each first bearing sleeve 24 is disposed between the support rod 21 and the support tube 3211 and the connecting rod 3212, and is used to isolate the support rod 21 from the support tube 3211 and the connecting rod 3212. The plurality of second bearing sleeves 25 are sleeved on the support rods 21 and are distributed on the support rods 21 at positions for supporting the rear end of the first wafer boat 101 and the front end and rear end of the second wafer boat 102. The plurality of stoppers 26 are fixedly disposed on the support rods 21, and are used to position the plurality of first bearing sleeves 24 and the plurality of second bearing sleeves 25, respectively.

In some embodiments, the support rod 21 is made of semiconductor material, and the plurality of first bearing sleeves 24 and the plurality of second bearing sleeves 25 are both made of insulating material.

As shown in FIG. 1, FIG. 2, and FIG. 6, the support rod 21 may be made of a high-strength semiconductor material, such that the support rod 21 has excellent characteristics such as high hardness, high strength, high temperature resistance and corrosion resistance, thereby improving the stability of the support rod 21 and extending the service life. The first end 211 and the second end 212 of the support rod 21 are connected to the front flange 11 and the rear flange 12 through the bearing block 22, such that the first wafer boat 101 and the second wafer boat 102 are both carried in a soft-landing manner. Two first bearing sleeves 24 are respectively arranged on the first ends 211 of the two support rods 21, and a length thereof extends to the position of the terminal (i.e., the front boat foot) of the first wafer boat 101, such that the support tube 3211 of the first electrode mechanism 3 is sleeved thereon. The plurality of first bearing sleeves 24 are made of an insulating material such as ceramic to achieve insulation between the support tube 3211 and the support rod 21, thereby preventing a short circuit between the two. However, it should be noted that when the support rod 21 is made of an insulating material, the specific material of the plurality of first bearing sleeves 24 may not be considered. Two second bearing sleeves 25 are arranged on the two support rods 21 close to the second ends 212 of the two support rods 21, and are used to cooperate with each other to support the rear boat foot of the second wafer boat 102. Four second bearing sleeves 25 are arranged on the two support rods 21 close to a middle position of each of the support rods 21. The two second bearing sleeves 25 arranged close to the second ends 212 are used to cooperate with each other to support the front boat foot of the second wafer boat 102. The two second bearing sleeves 25 arranged close to the first end 211 cooperate with the two first electrode mechanisms 3 to support the front boat foot and the rear boat foot of the first wafer boat 101. The plurality of second bearing sleeves 25 are made of an insulating material such as ceramic to achieve insulation between the second wafer boat 102 and the support rod 21, thereby preventing a short circuit between the two. However, it should be noted that when the support rod 21 is made of an insulating material, the specific material of the plurality of second bearing sleeves 25 may not be considered. The plurality of stopper 26 are made of a metal material with a certain elasticity, and each of the plurality of stoppers 26 may have an annular structure. The plurality of stoppers 26 may be respectively arranged corresponding to the plurality of first bearing sleeves 24 and the plurality of second bearing sleeves 25, and are sleeved on the support rod 21. The plurality of stoppers 26 may fix the plurality of first bearing sleeves 24 and the plurality of second bearing sleeves 25 to prevent them from moving axially along the support rod 21. At the same time, the plurality of first bearing sleeves 24 and the plurality of second bearing sleeves 25 may flexibly rotate relative to the support rod 21, such that the boat feet of the first wafer boat 101 and the second wafer boat 102 can slide between the two support rods 21 more easily, thereby improving the operation efficiency and stability of transferring the wafer boats.

In some embodiments, as shown in FIGS. 1 and 2, one of the two second electrode mechanisms 4 includes a first introduction rod 41, and the other includes a second introduction rod 42. The first introduction rod 41 and the second introduction rod 42 are both arranged on the rear furnace door of the process chamber for electrical connection with the rear end of the second wafer boat 102, and the polarities of the first introduction rod 41 and the second introduction rod 42 are opposite.

As shown in FIG. 1 and FIG. 2, the first introduction rod 41 and the second introduction rod 42 are both rear-insertion electrode rods, and are both arranged on the rear furnace door (not shown) of the process chamber for connection with the RF power supply. The first introduction rod 41 and the second introduction rod 42 are both used to connect to electrode sockets on the second wafer boat 102 to provide the electrical connection with the second wafer boat 102. Because the two electrode sockets of the second wafer boat 102 are arranged in an up-and-down distribution manner, the first introduction rod 41 and the second introduction rod 42 are arranged in a corresponding manner. That is, the first introduction rod 41 and the second introduction rod 42 are arranged in an up-and-down distribution manner. Further, the first introduction rod 41 may be a positive electrode, and the second introduction rod 42 may be a negative electrode. But the embodiments of the present disclosure are not limited thereto. The positions and polarities of the first introduction rod 41 and the second introduction rod 42 may be interchanged. With the above design, due to a plug-in/pressing connection, the second electrode mechanism 4 and the second wafer boat 102 achieves a soft-landing electrode connection mode, thereby substantially improving the process stability and the process yield of the silicon wafer. It should be noted that the embodiments of the present disclosure do not limit the specific implementation of the second electrode mechanism 4. For example, the second electrode mechanism 4 may also adopt a same structure as the first electrode mechanism 3 to introduce the electrodes into the second wafer boat 102. Therefore, the embodiments of the present disclosure are not limited thereto. Those skilled in the art may adjust the configurations according to actual conditions.

Based on the same inventive concept, the present disclosure also provides a semiconductor process device. The semiconductor process device includes a process chamber as provided in the above embodiments. The first electrode mechanism in the process chamber is used to introduce the electrodes into the first wafer boat, and the second electrode mechanism is used to introduce the electrodes into the second wafer boat.

The embodiments of the present disclosure at least achieve the following beneficial effects. The embodiments of the present disclosure provide the support mechanism in the furnace tube, the first electrode mechanism at the first end of the support rod, and the second electrode mechanism at the furnace tail of the furnace tube. The first wafer boat is supported by the first electrode mechanism in cooperation with the support rod, and the first electrode mechanism introduces the electrodes into the first wafer boat. The second wafer boat is supported by the support rod, and the second electrode mechanism introduces the electrodes into the second wafer boat, to prevent the first electrode mechanism from moving with the cantilever paddles and the front furnace door, thereby not only making the structure of the first electrode mechanism simple, but also substantially reducing the occupied space. In addition, because the support rod and the first electrode mechanism are used to carry the first wafer boat, various disadvantages caused by the cantilever structure in the prior art can be avoided, thereby optimizing the performance of the semiconductor process device.

It should be understood that the above embodiments are merely exemplary embodiments used to illustrate the principles of the present disclosure, but the present disclosure is not limited thereto. For those skilled in the art, various modifications and improvements can be made without departing from the spirit and essence of the present disclosure, and these modifications and improvements are also considered to be the scope of the present disclosure.

In the description of the present disclosure, it should be understood that the terms "center", "upper", "lower", "front", "back", "left", "right", "vertical", "horizontal", "top", "bottom", "inside", "outside" and the like indicate an orientation or a position relationship based on the orientation or the position relationship shown in the drawings, which is only for the convenience of describing the present disclosure and simplifying the description, rather than indicating or implying that the device or component referred to must have a specific orientation, be constructed and operated in a specific orientation, and therefore cannot be construed as limiting the present disclosure.

The terms "first" and "second" are used only for descriptive purposes, and cannot be construed as indicating or implying relative importance or implicitly indicating the number of technical features indicated. Therefore, the features defined as "first" and "second" may explicitly or implicitly include one or more of the features. In the description of the present disclosure, unless otherwise specified, "multiple" refers to two or more.

In the description of the present disclosure, it should be noted that, unless otherwise clearly specified and defined, the terms "installed", "connected", and "coupled" should be understood in a broad sense. For example, it can be a fixed connection, a detachable connection, or an integral connection. It can be directly connected, or indirectly connected through an intermediate medium, or it can be the internal connection of two components. For those skilled in the art, the specific meanings of the above terms in the present disclosure can be understood according to specific circumstances.

The above is merely a partial implementation of the present disclosure. It should be pointed out that for those skilled in the art, without departing from the principle of the present disclosure, various improvements and modifications can be made, and these improvements and modifications should also be regarded as the scope of the present disclosure.

What is claimed is:

1. A process chamber of a semiconductor process device, comprising:
   a furnace tube;
   a front flange;
   a rear flange;
   a support mechanism;
   a first electrode mechanism; and
   a second electrode mechanism;

wherein:
   the front flange and the rear flange are respectively arranged at a furnace mouth and a furnace tail of the furnace tube;
   the support mechanism is arranged in the furnace tube and includes two support rods, a first end of each support rod is connected to the front flange, a second end of each support rod is connected to the rear flange, and the two support rods are used to carry a first wafer boat and a second wafer boat;
   the first electrode mechanism includes two first electrode mechanisms which are respectively sleeved on the first ends of the two support rods, the two first electrode mechanisms have opposite polarities and are used to carry a front end of the first wafer boat when the first wafer boat is loaded on the support rods and are respectively electrically connected to two terminals at the front end of the first wafer boat to introduce electrodes into the first wafer boat;
   the second electrode mechanism includes two second electrode mechanisms which are both arranged at the furnace tail of the furnace tube, and are used to introduce electrodes into the second wafer boat when the second wafer boat is loaded on the support rods;
   each first electrode mechanism includes an electrode support assembly and an electrode introduction assembly, the electrode support assembly is sleeved on the first end of the corresponding support rod, when the first wafer boat is loaded on the support rods, the electrode support assembly carries the front end of the first wafer boat and is electrically connected to the corresponding terminal at the front end of the first wafer boat; and
   the electrode introduction assembly is inserted into the front flange, one end of the electrode introduction assembly is electrically connected to the electrode support assembly, and the other end of the electrode introduction assembly is electrically connected to an RF power supply.

2. The process chamber according to claim 1, wherein:
   the support mechanism also includes a plurality of bearing blocks, the plurality of bearing blocks are arranged on the front flange and the rear flange, the first end and the second end of each support rod are respectively fixedly connected to the front flange and the rear flange through at least one bearing block; and
   the electrode support assembly is snap-fitted or plugged into each bearing block, and the two are electrically insulated from each other.

3. The process chamber according to claim 2, wherein:
   the electrode support assembly includes a support tube, a connecting rod, a connecting component, an insulating component, and an adapter block, the support tube is sleeved on an outer periphery of the support rod;
   the adapter block is detachably connected to the support tube to carry the front end of the first wafer boat, and is electrically connected to the terminal corresponding to the front end of the first wafer boat;
   one end of the connecting rod is fixedly connected to the support tube and electrically conductive, the other end of the connecting rod is fixedly connected to the connecting component and electrically conductive, and the connecting rod is arranged along an extension direction of the support rod;
   the connecting component is clamped or plugged with each bearing block, and is electrically connected to the electrode introduction assembly; and the insulating component is arranged between the connecting component and each bearing block to electrically insulate the two.

4. The process chamber according to claim 3, wherein:

the electrode support assembly also includes a positioning end plate and a positioning member, the positioning end plate is arranged on an outer peripheral wall of the support tube, and the positioning member is used to position and connect the adapter block with the positioning end plate.

5. The process chamber according to claim 3, wherein:

the connecting component includes a supporting plate and a connecting plate, and one end of the supporting plate is fixedly connected to the connecting rod and electrically conductive;

the connecting plate is a bent structure having two bent portions arranged at an angle, one of the two bent portions is fitted with the insulating component and fixedly connected to the other end of the supporting plate and is electrically conductive;

the other bent portion is fixedly connected to the electrode introduction assembly and is conductive; and a step is provided on the insulating component for supporting the supporting plate.

6. The process chamber according to claim 3, wherein:

the support mechanism further includes a plurality of first bearing sleeves, a plurality of second bearing sleeves, and a plurality of stoppers, each first bearing sleeve is disposed between the support rod and the support tube and the connecting rod, and is used to isolate the support rod from the support tube and the connecting rod;

the plurality of second bearing sleeves are sleeved on the support rods and are distributed on the support rods at positions for supporting the rear end of the first wafer boat and the front end and rear end of the second wafer boat; and the plurality of stoppers are fixedly disposed on the support rods, and are used to position the plurality of first bearing sleeves and the plurality of second bearing sleeves, respectively.

7. The process chamber according to claim 6, wherein:

the support rod is made of semiconductor material, and the plurality of first bearing sleeves and the plurality of second bearing sleeves are both made of insulating material.

8. The process chamber according to claim 2, wherein:

the support mechanism further includes a clamping member, a limiting groove is provided on each bearing block for accommodating the first end or the second end of the support rod, the clamping member is provided on each bearing block to press the first end or the second end into the limiting groove.

9. The process chamber according to claim 1, wherein:

a connecting pipe is provided on a peripheral wall of the front flange passing through the front flange;

the electrode introduction assembly includes an introduction rod, an insulating sleeve, and a socket, the insulating sleeve is sleeved on an outer periphery of the introduction rod and penetrates through the connecting pipe, one end of the introduction rod is electrically connected to the electrode support assembly, and the other end of the introduction rod is electrically connected to the socket;

a sealing boss is provided on an outer periphery of an end of the insulating sleeve facing toward the socket, which is used for sealing connection with an end of the connecting pipe; and the socket is sleeved on an outer periphery of the end of the connecting pipe, which is used for pressing the sealing boss onto the end of the connecting pipe.

10. The process chamber according to claim 1, wherein:

one of the two second electrode mechanisms includes a first introduction rod, and the other includes a second introduction rod, the first introduction rod and the second introduction rod are both arranged on the rear furnace door of the process chamber for electrical connection with the rear end of the second wafer boat, and the polarities of the first introduction rod and the second introduction rod are opposite.

11. A process chamber of a semiconductor process device, comprising:

a furnace tube;

a front flange;

a rear flange;

a support mechanism;

a first electrode mechanism; and a second electrode mechanism;

wherein:

the front flange and the rear flange are respectively arranged at a furnace mouth and a furnace tail of the furnace tube;

the support mechanism is arranged in the furnace tube and includes two support rods, a first end of each support rod is connected to the front flange, a second end of each support rod is connected to the rear flange, and the two support rods are used to carry a first wafer boat and a second wafer boat;

the first electrode mechanism includes two first electrode mechanisms which are respectively sleeved on the first ends of the two support rods, the two first electrode mechanisms have opposite polarities and are used to carry a front end of the first wafer boat when the first wafer boat is loaded on the support rods and are respectively electrically connected to two terminals at the front end of the first wafer boat to introduce electrodes into the first wafer boat;

the second electrode mechanism includes two second electrode mechanisms which are both arranged at the furnace tail of the furnace tube, and are used to introduce electrodes into the second wafer boat when the second wafer boat is loaded on the support rods.

12. A semiconductor process device, comprising a process chamber, wherein the process chamber includes:

a furnace tube;

a front flange;

a rear flange;

a support mechanism;

a first electrode mechanism; and a second electrode mechanism;

wherein:

the front flange and the rear flange are respectively arranged at a furnace mouth and a furnace tail of the furnace tube;

the support mechanism is arranged in the furnace tube and includes two support rods, a first end of each support rod is connected to the front flange, a second end of each support rod is connected to the rear flange, and the two support rods are used to carry a first wafer boat and a second wafer boat;

the first electrode mechanism includes two first electrode mechanisms which are respectively sleeved on the first ends of the two support rods, the two first electrode mechanisms have opposite polarities and are used to carry a front end of the first wafer boat when the first wafer boat is loaded on the support rods and are respectively electrically connected to two terminals at the front end of the first wafer boat to introduce electrodes into the first wafer boat;

the second electrode mechanism includes two second electrode mechanisms which are both arranged at the furnace tail of the furnace tube, and are used to introduce electrodes into the second wafer boat when the second wafer boat is loaded on the support rods;

each first electrode mechanism includes an electrode support assembly and an electrode introduction assembly, the electrode support assembly is sleeved on the first end of the corresponding support rod, when the first wafer boat is loaded on the support rods, the electrode support assembly carries the front end of the first wafer boat and is electrically connected to the corresponding terminal at the front end of the first wafer boat; and the electrode introduction assembly is inserted into the front flange, one end of the electrode introduction assembly is electrically connected to the electrode support assembly, and the other end of the electrode introduction assembly is electrically connected to an RF power supply.

<div align="center">*   *   *   *   *</div>